(12) United States Patent
Won et al.

(10) Patent No.: US 10,360,105 B2
(45) Date of Patent: Jul. 23, 2019

(54) SEMICONDUCTOR DEVICES AND SEMICONDUCTOR SYSTEMS INCLUDING THE SAME

(71) Applicant: SK hynix Inc., Icheon-si, Gyeonggi-do (KR)

(72) Inventors: Hyung Sik Won, Cheongju-si (KR); Hae Rang Choi, Gwangju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 142 days.

(21) Appl. No.: 15/458,430

(22) Filed: Mar. 14, 2017

(65) Prior Publication Data
US 2018/0067796 A1   Mar. 8, 2018

(30) Foreign Application Priority Data
Sep. 5, 2016   (KR) .................. 10-2016-0113706

(51) Int. Cl.
| | | |
|---|---|---|
| *G06F 11/00* | (2006.01) | |
| *G06F 11/10* | (2006.01) | |
| *G06F 3/06* | (2006.01) | |
| *G11C 29/44* | (2006.01) | |
| *G11C 29/50* | (2006.01) | |
| *G11C 29/00* | (2006.01) | |

(52) U.S. Cl.
CPC .......... *G06F 11/108* (2013.01); *G06F 3/0619* (2013.01); *G06F 3/0659* (2013.01); *G06F 3/0679* (2013.01); *G06F 11/1044* (2013.01); *G11C 29/4401* (2013.01); *G11C 29/50016* (2013.01); *G11C 29/82* (2013.01); *G11C 2029/4402* (2013.01)

(58) Field of Classification Search
CPC ............... G06F 11/1076; G06F 11/108; G06F 11/1088; G06F 11/1092; G06F 11/1096; G06F 11/0706
USPC ........................................ 714/6.24
See application file for complete search history.

(56) References Cited

U.S. PATENT DOCUMENTS

| | | | |
|---|---|---|---|
| 2006/0095470 A1* | 5/2006 | Cochran | G06F 17/30067 |
| 2014/0052948 A1* | 2/2014 | Qiu | G06F 9/485 |
| | | | 711/162 |

(Continued)

FOREIGN PATENT DOCUMENTS

| | | |
|---|---|---|
| KR | 20140125981 A | 10/2014 |
| KR | 20160016051 A | 2/2016 |

*Primary Examiner* — Sarai E Butler
(74) *Attorney, Agent, or Firm* — William Park & Associates Ltd.

(57) ABSTRACT

A semiconductor device may be provided. The semiconductor device may include a memory area. The memory area may be configured to compare an address with a first failure address and a second failure address to store an input datum into a redundancy area and to output the stored input datum as an output datum or configured to compare the address with the first and failure addresses to correct an error of an input datum stored in a normal area to output the corrected input datum as the output datum. The semiconductor device may include a failure address storage circuit. The failure address storage circuit may be configured to store the address as a first failure address based on a first retention information signal and configured to store the address as a second failure address based on a second retention information signal.

25 Claims, 9 Drawing Sheets

(56) References Cited

U.S. PATENT DOCUMENTS

| | | | | |
|---|---|---|---|---|
| 2015/0058678 A1* | 2/2015 | Wang | ..................... | G11C 29/08 |
| | | | | 714/42 |
| 2015/0095723 A1* | 4/2015 | Han | ....................... | G11C 29/56 |
| | | | | 714/54 |
| 2015/0193302 A1* | 7/2015 | Hyun | .................... | G11C 29/52 |
| | | | | 714/764 |
| 2016/0350180 A1* | 12/2016 | Halbert | ............... | G06F 11/1068 |
| 2017/0133108 A1* | 5/2017 | Lee | ........................ | G11C 29/76 |

* cited by examiner

SEMICONDUCTOR DEVICES AND SEMICONDUCTOR SYSTEMS INCLUDING THE SAME

CROSS-REFERENCE TO RELATED APPLICATIONS

The present application claims priority under 35 U.S.C 119(a) to Korean Application No. 10-2016-0113706, filed on Sep. 5, 2016, which is incorporated herein by reference in its entirety.

BACKGROUND

1. Technical Field

Embodiments of the present disclosure may generally relate to semiconductor devices relating to correcting data errors and semiconductor systems including the same.

2. Related Art

Attempts to increase integration density in semiconductor devices have typically resulted in the increase of failed memory cells within the fabrication process of the semiconductor devices. This may lead to lowering the fabrication yield of the semiconductor devices. Even though each semiconductor device has a single defective memory cell, the semiconductor device cannot be supplied to customers.

A lot of effort has been focused on improving the fabrication yield of highly integrated semiconductor devices. For example, various techniques for repairing addresses of failed memory cells with redundancy memory cells have been proposed to improve the fabrication yield of these highly integrated semiconductor devices.

Recently, a DDR2 scheme or a DDR3 scheme receiving and outputting four bit data or eight bit data during each clock cycle time has been used to improve an operation speed of the semiconductor devices. If a data transmission speed of the semiconductor devices becomes faster, the probability of causing errors increases while the data is transmitted within the semiconductor devices. Accordingly, novel design schemes may be required to guarantee a reliable transmission of the data.

Whenever data is transmitted within a semiconductor device, error codes which are capable of detecting occurrence of errors may be generated and are then transmitted with the data to improve the reliability of data transmission. The error codes may include an error detection code (EDC) which is capable of detecting errors and an error correction code (ECC) which is capable of correcting the errors by itself.

SUMMARY

According to an embodiment, a semiconductor system may include a first semiconductor device and a second semiconductor device. The first semiconductor device may be configured to output a command, an address and an input datum. The second semiconductor device may be configured to repair the address to store the input datum into a redundancy area and to output the input datum stored in the redundancy area as a output datum or correct an error of the input datum stored in a normal area to output the corrected input datum as the output datum, based on the command and the address according to a retention characteristic of a memory cell corresponding to the address. The retention characteristic may include a first retention characteristic or a second retention characteristic.

According to an embodiment, a semiconductor device may be provided. The semiconductor device may include a memory area. The memory area may be configured to compare an address with a first failure address and a second failure address to store an input datum into a redundancy area and to output the stored input datum as an output datum or configured to compare the address with the first and failure addresses to correct an error of an input datum stored in a normal area to output the corrected input datum as the output datum. The semiconductor device may include a failure address storage circuit. The failure address storage circuit may be configured to store the address as a first failure address based on a first retention information signal and configured to store the address as a second failure address based on a second retention information signal.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Figure 1:
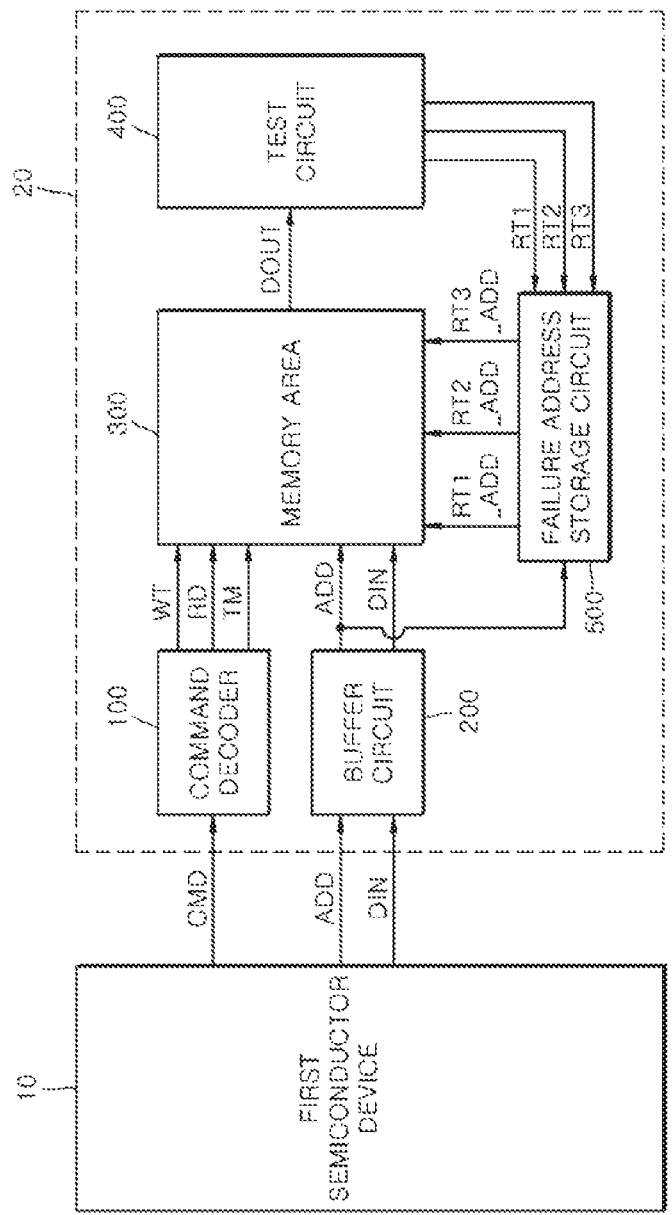
FIG. 1 is a block diagram illustrating a representation of an example of a configuration of a semiconductor system according to an embodiment.

Referring to FIG. 1, a semiconductor system according to an embodiment may include a first semiconductor device 10 and a second semiconductor device 20. The second semiconductor device 20 may include a command decoder 100, a buffer circuit 200, a memory area 300, a test circuit 400 and a failure address storage circuit 500.

The first semiconductor device 10 may output a command CMD, an address ADD and an input datum DIN. The first semiconductor device 10 may output the command CMD to put the second semiconductor device 20 into a condition for a test mode. The first semiconductor device 10 may generate the address ADD that is sequentially counted, in the test mode. The first semiconductor device 10 may output the input datum DIN having predetermined levels in the test mode. Although each of the command CMD and the address ADD is illustrated as a single signal in FIG. 1, each of the command CMD and the address ADD may be set to include a plurality of bits. The input datum DIN may have a logic "high" level or a logic "low" level.

The command decoder 100 may decode the command CMD to generate a write signal WT, a read signal RD and a test mode signal TM. The command decoder 100 may generate the test mode signal TM which is enabled if the command CMD has a combination for entering the test mode. The command decoder 100 may generate the write signal WT which is enabled if the command CMD has a combination for entering the test mode. The command decoder 100 may generate the read signal RD which is enabled after a first predetermined period from a point of time that the write signal WT is enabled, if the command CMD has a combination for entering the test mode. The command decoder 100 may generate the read signal RD which is enabled after a second predetermined period from a point of time that the write signal WT is enabled, if the command CMD has a combination for entering the test mode. The command decoder 100 may generate the read signal RD which is enabled after a third predetermined period from a point of time that the write signal WT is enabled, if the command CMD has a combination for entering the test mode. The read signal RD may be enabled after the first predetermined period for sensing a first retention characteristic from a point of time that the write signal WT is enabled. The read signal RD may be enabled after the second predetermined period for sensing a second retention characteristic from a point of time that the write signal WT is enabled. The read signal RD may be enabled after the third predetermined period for sensing a third retention characteristic from a point of time that the write signal WT is enabled. Explanations of the first, second and third retention characteristics will be described with reference to FIG. 2 later.

The buffer circuit 200 may receive and output the address ADD and the input datum DIN. The buffer circuit 200 may be realized using a general buffer and may buffer the address ADD and the input datum DIN to output the buffered address and the buffered input datum.

The memory area 300 may enter the test mode in response to the test mode signal TM. The memory area 300 may store the input datum DIN according to a combination of the address ADD in response to the write signal WT in the test mode. The memory area 300 may output the input datum DIN stored therein as an output datum DOUT in response to the read signal RD which is enabled after the first predetermined period in the test mode. The memory area 300 may output the input datum DIN stored therein as the output datum DOUT in response to the read signal RD which is enabled after the second predetermined period in the test mode. The memory area 300 may output the input datum DIN stored therein as the output datum DOUT in response to the read signal RD which is enabled after the third predetermined period in the test mode. The memory area 300 may change the address ADD in response to the write signal WT to store the input datum DIN into a redundancy area if a combination of the address ADD corresponds to a first failure address RT1_ADD after the test mode. The memory area 300 may change the address ADD in response to the read signal RD to output the input datum DIN stored in the redundancy area as the output datum DOUT if a combination of the address ADD corresponds to the first failure address RT1_ADD after the test mode. The memory area 300 may store the input datum DIN into a normal area in response to the write signal WT and may store a parity into an error correction area, if a combination of the address ADD corresponds to a second failure address RT2_ADD or a third failure address RT3_ADD after the test mode. The memory area 300 may correct an error of the input datum DIN with the parity and may output the corrected input datum as the output datum DOUT in response to the read signal RD, if a combination of the address ADD corresponds to the second failure address RT2_ADD or the third failure address RT3_ADD after the test mode.

The test circuit 400 may sense a level of the output datum DOUT after the first predetermined period in the test mode and may generate a first retention information signal RT1 which is enabled if the sensed level of the output datum DOUT corresponds to the first retention characteristic. The test circuit 400 may generate the first retention information signal RT1 which is enabled if the output datum DOUT does not have a predetermined level after the first predetermined period in the test mode. The test circuit 400 may sense a level of the output datum DOUT after the second predetermined period in the test mode and may generate a second retention information signal RT2 which is enabled if the sensed level of the output datum DOUT corresponds to the second retention characteristic. The test circuit 400 may generate the second retention information signal RT2 which is enabled if the output datum DOUT does not have a predetermined level after the second predetermined period in the test mode. The test circuit 400 may sense a level of the output datum DOUT after the third predetermined period in the test mode and may generate a third retention information signal RT3 which is enabled if the sensed level of the output datum DOUT corresponds to the third retention characteristic. The test circuit 400 may generate the third retention information signal RT3 which is enabled if the output datum DOUT does not have a predetermined level after the third predetermined period in the test mode. In some embodiments, the test circuit 400 may be disposed in an outside region of the second semiconductor device 20 to test the function of the second semiconductor device 20.

The failure address storage circuit 500 may store the address ADD as the first failure address RT1_ADD in response to the first retention information signal RT1 in the test mode. The failure address storage circuit 500 may store the address ADD as the second failure address RT2_ADD in response to the second retention information signal RT2 in the test mode. The failure address storage circuit 500 may store the address ADD as the third failure address RT3_ADD in response to the third retention information signal RT3 in the test mode. The first failure address RT1_ADD may include position information on a memory cell having the first retention characteristic. The second failure address RT2_ADD may include position information on a memory cell having the second retention characteristic. The third failure address RT3_ADD may include position information on a memory cell having the third retention characteristic. Although each of the first, second and third failure addresses RT1_ADD, RT2_ADD and RT3_ADD is illustrated as a single signal in FIG. 1, each of the first, second and third failure addresses RT1_ADD, RT2_ADD and RT3_ADD may be set to include a plurality of signals. That is, each of the first, second and third failure addresses RT1_ADD, RT2_ADD and RT3_ADD may be set to include position information of a plurality of memory cells.

The second semiconductor device 20 having an aforementioned configuration may repair the address ADD corresponding to the first retention characteristic to store the input datum DIN into the redundancy area, in response to the command CMD and the address ADD. In addition, the second semiconductor device 20 may repair the address ADD corresponding to the first retention characteristic to output the input datum DIN stored in the redundancy area as the output datum DOUT, in response to the command CMD and the address ADD. Moreover, the second semiconductor device 20 may store the input datum DIN into the normal area or may output the input datum DIN stored in the normal area as the output datum DOUT according to a combination of the address ADD corresponding to the second or third retention characteristic, in response to the command CMD and the address ADD. In such a case, the second semiconductor device 20 may correct an error of the input datum DIN and may output the corrected input datum as the output datum DOUT.

The first, second and third retention characteristics will be described hereinafter with reference to FIG. 2.

The memory area 300 may store the input datum DIN in response to the write signal WT and may output the stored input datum DIN as the output datum DOUT at a point of time "T1" that the first predetermined period elapses from a point of time that the write signal WT is enabled, in the test mode.

The test circuit 400 may sense a level of the output datum DOUT and may regard a memory cell corresponding to the output datum DOUT as a failed bit to generate the first retention information signal RT1 if the output datum DOUT does not have a predetermined level.

The failure address storage circuit 500 may store the address ADD as the first failure address RT1_ADD in response to the first retention information signal RT1. In such a case, a memory cell corresponding to the first failure address RT1_ADD means a memory cell having the first retention characteristic.

The memory area 300 may store the input datum DIN in response to the write signal WT and may output the stored input datum DIN as the output datum DOUT at a point of time "T2" that the second predetermined period elapses from a point of time that the write signal WT is enabled, in the test mode.

The test circuit 400 may sense a level of the output datum DOUT and may regard a memory cell corresponding to the output datum DOUT as a failed bit to generate the second retention information signal RT2 if the output datum DOUT does not have a predetermined level.

The failure address storage circuit 500 may store the address ADD as the second failure address RT2_ADD in response to the second retention information signal RT2. In such a case, a memory cell corresponding to the second failure address RT2_ADD means a memory cell having the second retention characteristic.

The memory area 300 may store the input datum DIN in response to the write signal WT and may output the stored input datum DIN as the output datum DOUT at a point of time "T3" that the third predetermined period elapses from a point of time that the write signal WT is enabled, in the test mode.

The test circuit 400 may sense a level of the output datum DOUT and may regard a memory cell corresponding to the output datum DOUT as a failed bit to generate the third retention information signal RT3 if the output datum DOUT does not have a predetermined level.

The failure address storage circuit 500 may store the address ADD as the third failure address RT3_ADD in response to the third retention information signal RT3. In such a case, a memory cell corresponding to the third failure address RT3_ADD means a memory cell having the third retention characteristic.

Figure 2:
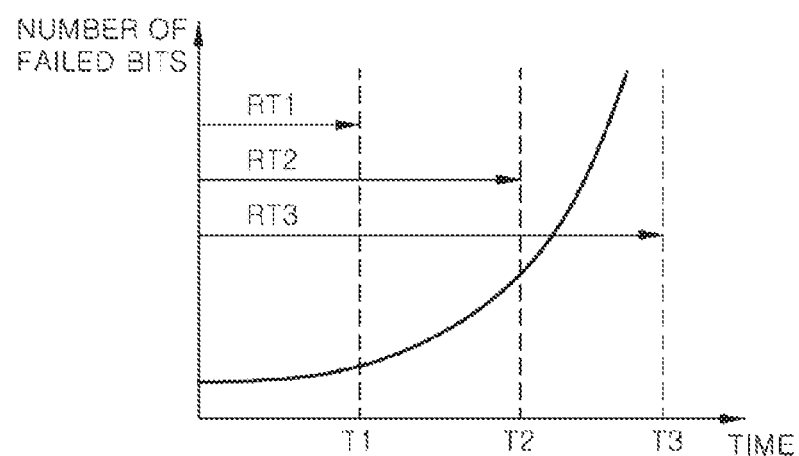
FIG. 2 is a graph illustrating a representation of an example of a retention characteristic of a memory area included in the semiconductor system of FIG. 1.

Referring to FIG. 2, the number of the failed bits among the output data DOUT outputted from the memory area 300 may increase as the time elapses.

Figure 3:
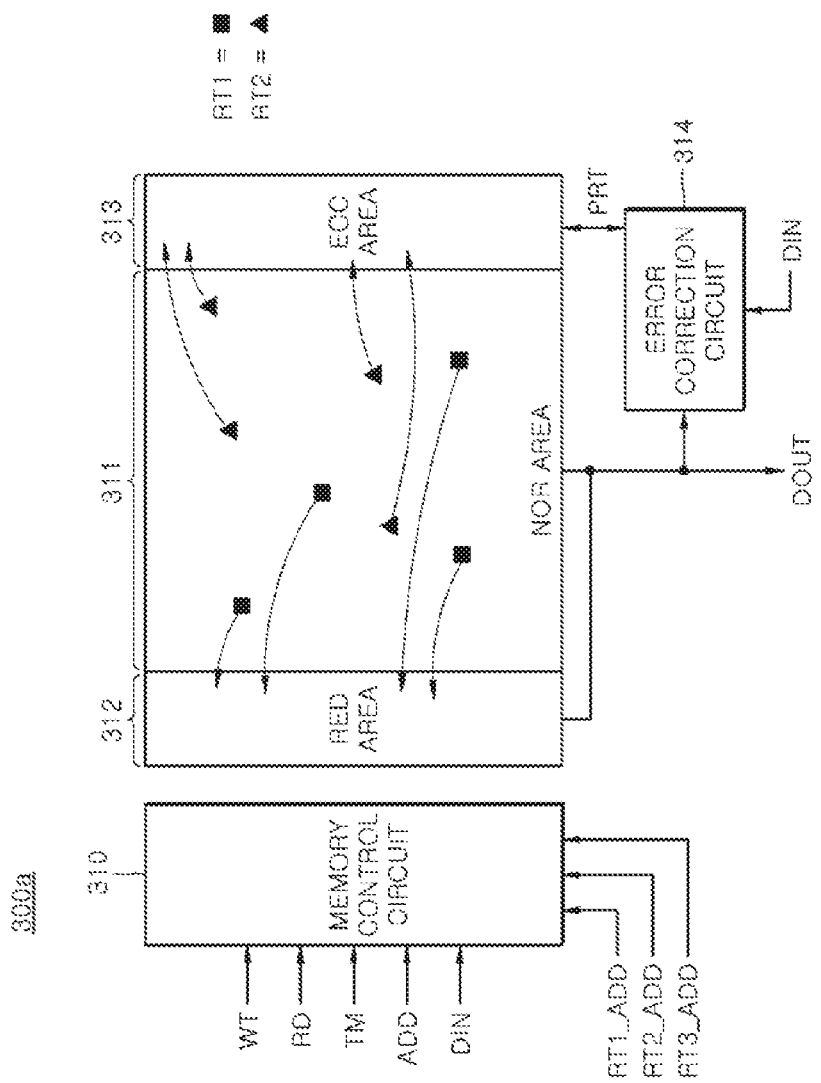
FIGS. 3 to 7 are block diagrams illustrating representations of configurations of other examples of a memory area included in the semiconductor system of FIG. 1.

An operation of a memory area 300a corresponding to a first example of the memory area 300 illustrated in FIG. 1 will be described hereinafter with reference to FIG. 3 in conjunction with the first and second retention characteristics.

The memory area 300a may include a memory control circuit 310, a normal area 311, a redundancy area 312, an error correction area 313 and an error correction circuit 314.

The memory control circuit 310 may access the normal area 311 according to the write signal WT, the read signal RD and a combination of the address ADD, if the test mode signal TM is enabled. The normal area 311 may store the input datum DIN having a predetermined level and may output the stored input datum DIN as the output datum DOUT, according to a combination of the address ADD.

The memory control circuit 310 may access the normal area 311 and the error correction area 313 according to a combination of the address ADD in response to the write signal WT or the read signal RD, if the test mode signal TM is disabled. The memory control circuit 310 may access a memory cell of the redundancy area 312 to store the input datum DIN into the memory cell of the redundancy area 312 or to output the stored input datum DIN as the output datum DOUT without accessing to memory cells (see the memory cells indicated by a symbol "■") having the first retention characteristic in the normal area 311, if a combination of the address ADD corresponds to the first failure address RT1_ADD. That is, the memory control circuit 310 may change the address ADD to access the redundancy area 312 if a combination of the address ADD corresponds to the first failure address RT1_ADD.

The memory control circuit 310 may access the normal area 311 and the error correction area 313 according to a combination of the address ADD in response to the write signal WT, if the test mode signal TM is disabled. The memory control circuit 310 may store the input datum DIN into memory cells (see the memory cells indicated by a symbol "▲") having the second retention characteristic in the normal area 311, if a combination of the address ADD corresponds to the second failure address RT2_ADD.

The error correction circuit 314 may generate a parity PRT including error information on the input datum DIN and may store the parity PRT into the error correction area 313.

The memory control circuit 310 may access the normal area 311 and the error correction area 313 according to a combination of the address ADD in response to the read signal RD, if the test mode signal TM is disabled. The memory control circuit 310 may output the input datum DIN stored in memory cells (see the memory cells indicated by the symbol "▲") having the second retention characteristic in the normal area 311 as the output datum DOUT, according to a combination of the address ADD. The memory control circuit 310 may output the parity PRT from the error correction area 313 according to a combination of the address ADD.

The error correction circuit 314 may correct an error of the input datum DIN with the parity PRT and may output the corrected input datum as the output datum DOUT.

An operation performed by the memory control circuit 310 if a combination of the address ADD corresponds to the third failure address RT3_ADD may be the same as the operation performed by the memory control circuit 310 if a combination of the address ADD corresponds to the second failure address RT2_ADD.

As described above, the memory area 300a may change the address ADD to store the input datum DIN into the redundancy area 312 and to output the stored input datum DIN stored in the redundancy area 312 as the output datum DOUT, if a combination of the address ADD corresponds to the first failure address RT1_ADD after the test mode. In addition, the memory area 300a may store the input datum DIN into the normal area 311, may store the parity PRT into the error correction area 313, and may correct an error of the input datum DIN with the parity PRT to output the corrected input datum as the output datum DOUT, if a combination of the address ADD corresponds to the second failure address RT2_ADD after the test mode.

Figure 4:
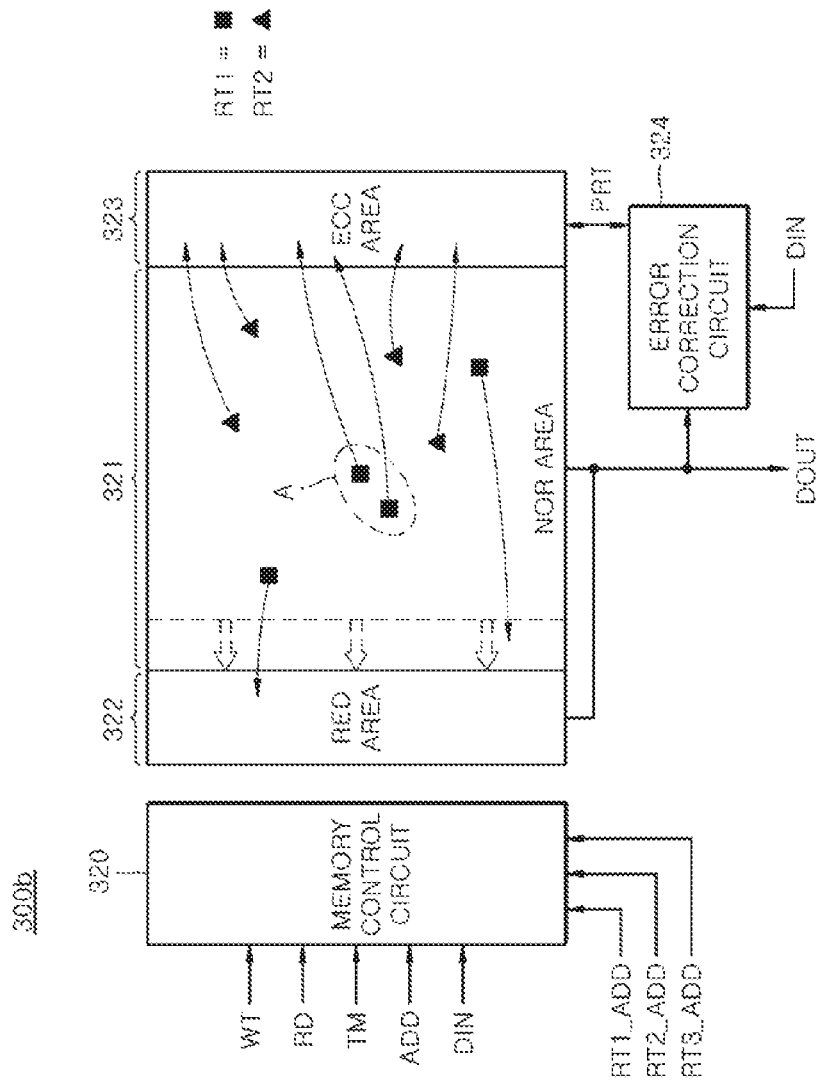

An operation of a memory area 300b corresponding to a second example of the memory area 300 illustrated in FIG. 1 will be described hereinafter with reference to FIG. 4 in conjunction with the first and second retention characteristics.

The memory area 300b may include a memory control circuit 320, a normal area 321, a redundancy area 322, an error correction area 323 and an error correction circuit 324.

The memory control circuit 320 may access the normal area 321 according to the write signal WT, the read signal RD and a combination of the address ADD, if the test mode signal TM is enabled. The normal area 321 may store the input datum DIN having a predetermined level and may output the stored input datum DIN as the output datum DOUT, according to a combination of the address ADD.

The memory control circuit 320 may access the normal area 321 and the error correction area 323 according to a combination of the address ADD in response to the write signal WT or the read signal RD, if the test mode signal TM is disabled. The memory control circuit 320 may access a memory cell of the redundancy area 322 to store the input datum DIN into the memory cell of the redundancy area 322 or to output the stored input datum DIN as the output datum DOUT without accessing to memory cells out of a region "A" among memory cells (see the memory cells indicated by a symbol "■") having the first retention characteristic in the normal area 321, if a combination of the address ADD corresponds to the first failure address RT1_ADD. That is, the memory control circuit 320 may change the address ADD (having a first combination) out of the region "A" to access the redundancy area 322 if a combination of the address ADD corresponds to the first failure address RT1_ADD. The region "A" may correspond to a portion of the normal area 321. A position of the region "A" located in the normal area 321 may be set to be different according to the embodiments.

The memory control circuit 320 may access the normal area 321 and the error correction area 323 according to a combination of the address ADD in response to the write signal WT, if the test mode signal TM is disabled. The memory control circuit 320 may store the input datum DIN into memory cells (see the memory cells indicated by a symbol "▲") having the second retention characteristic in the normal area 321, if a combination of the address ADD corresponds to the second failure address RT2_ADD. The memory control circuit 320 may store the input datum DIN into memory cells (see the memory cells indicated by a symbol "■") of the region "A", if the address ADD has a second combination corresponding to the region "A" having the first retention characteristic. The address ADD having the second combination means an address having a combination for accessing to the region "A".

The error correction circuit 324 may generate a parity PRT including error information on the input datum DIN and may store the parity PRT into the error correction area 323.

The memory control circuit 320 may access the normal area 321 and the error correction area 323 according to a combination of the address ADD in response to the read signal RD, if the test mode signal TM is disabled. The memory control circuit 320 may output the input datum DIN stored in memory cells (see the memory cells indicated by the symbol "▲") having the second retention characteristic in the normal area 321 as the output datum DOUT, according to a combination of the address ADD. The memory control circuit 320 may output the input datum DIN stored in memory cells (see the memory cells indicated by the symbol "■") of the region "A" having the first retention characteristic as the output datum DOUT, if the address ADD has the second combination. The memory control circuit 320 may output the parity PRT from the error correction area 323 according to a combination of the address ADD.

The error correction circuit 324 may correct an error of the input datum DIN with the parity PRT and may output the corrected input datum as the output datum DOUT.

An operation performed by the memory control circuit 320 if a combination of the address ADD corresponds to the third failure address RT3_ADD may be the same as the operation performed by the memory control circuit 320 if a combination of the address ADD corresponds to the second failure address RT2_ADD.

As described above, the memory area 300b may change the address ADD having the first combination to store the input datum DIN into the redundancy area 322 and to output the input datum DIN stored in the redundancy area 322 as the output datum DOUT, if a combination of the address ADD corresponds to the first failure address RT1_ADD after the test mode. In addition, the memory area 300b may store the input datum DIN into the normal area 321 in response to the address ADD having the second combination, may store the parity PRT into the error correction area 323, and may correct an error of the input datum DIN with the parity PRT to output the corrected input datum as the output datum DOUT, if a combination of the address ADD corresponds to the first failure address RT1_ADD after the test mode. Moreover, the memory area 300b may store the input datum DIN into the normal area 321, may store the parity PRT into the error correction area 323, and may correct an error of the input datum DIN with the parity PRT to output the corrected input datum as the output datum DOUT, if a combination of the address ADD corresponds to the second failure address RT2_ADD after the test mode. Accordingly, since the memory area 300b does not convert the addresses ADD corresponding to the region "A" into addresses of the redundancy area 322, a size of the redundancy area 322 may be reduced to increase a size of the normal area 321.

Figure 5:
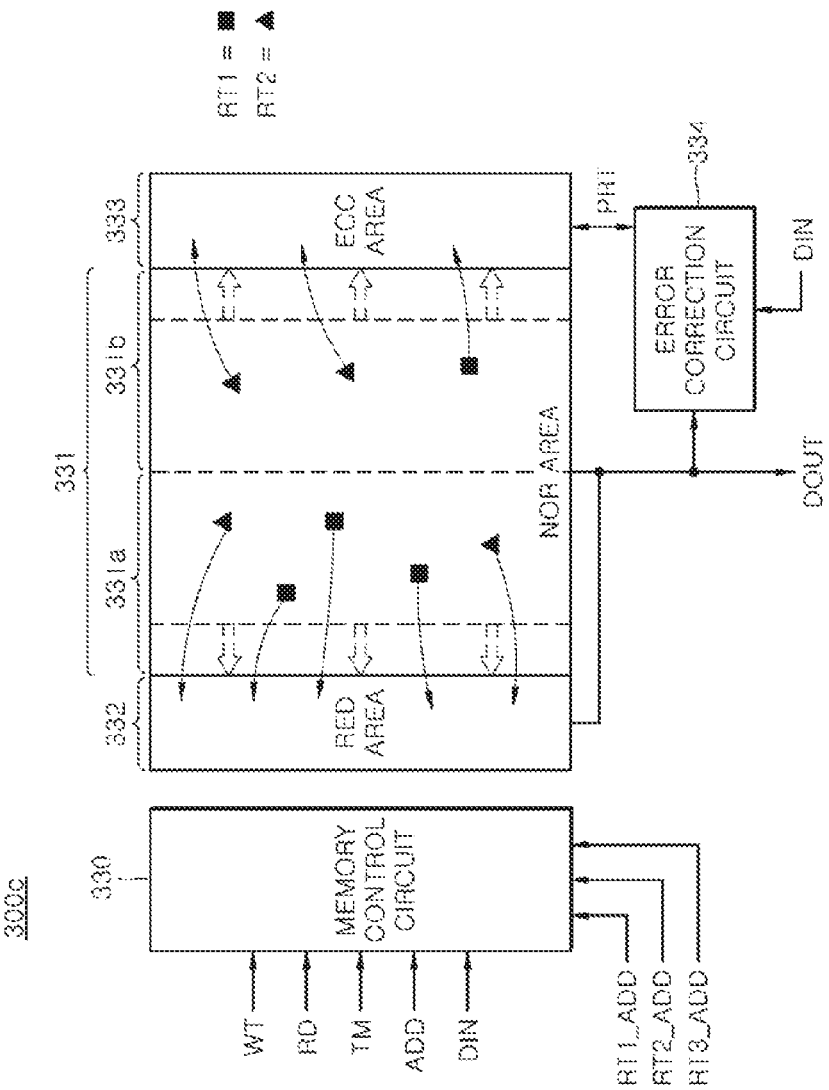

An operation of a memory area 300c corresponding to a third example of the memory area 300 illustrated in FIG. 1 will be described hereinafter with reference to FIG. 5 in conjunction with the first and second retention characteristics.

The memory area 300c may include a memory control circuit 330, a normal area 331, a redundancy area 332, an error correction area 333 and an error correction circuit 334. The normal area 331 may include a first normal area 331a and a second normal area 331b.

The memory control circuit 330 may access the normal area 331 according to the write signal WT, the read signal RD and a combination of the address ADD, if the test mode signal TM is enabled. The normal area 331 may store the input datum DIN having a predetermined level and may output the stored input datum DIN as the output datum DOUT, according to a combination of the address ADD.

The memory control circuit 330 may access the normal area 331 and the error correction area 333 according to a combination of the address ADD in response to the write signal WT or the read signal RD, if the test mode signal TM is disabled.

The memory control circuit 330 may access a memory cell of the redundancy area 332 to store the input datum DIN into the memory cell of the redundancy area 332 or to output the input datum DIN stored in the redundancy area 332 as the output datum DOUT without accessing to memory cells (see the memory cells indicated by a symbol "■" or a symbol "▲") having the first or second retention characteristic in the first normal area 331a, if a combination of the address ADD designates memory cells in the first normal area 331a and corresponds to the first or second failure address RT1_ADD or RT2_ADD. That is, the memory control circuit 330 may change the address ADD to access the redundancy area 332 if a combination of the address ADD designates memory cells in the first normal area 331a and corresponds to the first or second failure address RT1_ADD or RT2_ADD.

The memory control circuit 330 may access the second normal area 331b and the error correction area 333 in response to the write signal WT, if the test mode signal TM is disabled and a combination of the address ADD designates the second normal area 331b. The memory control circuit 330 may store the input datum DIN into memory cells (see the memory cells indicated by a symbol "■" or a symbol "▲") having the first or second retention characteristic in the second normal area 331b, if a combination of the address ADD designates the second normal area 331b and corresponds to the first or second failure address RT1_ADD or RT2_ADD.

The error correction circuit 334 may generate a parity PRT including error information on the input datum DIN and may store the parity PRT into the error correction area 333.

The memory control circuit 330 may access the second normal area 331b and the error correction area 333 in response to the read signal RD, if the test mode signal TM is disabled and a combination of the address ADD designates the second normal area 331b. The memory control circuit 330 may output the input datum DIN stored in memory cells (see the memory cells indicated by the symbol "■" or the symbol "▲") having the first or second retention characteristic in the second normal area 331b as the output datum DOUT, according to a combination of the address ADD. The memory control circuit 330 may output the parity PRT from the error correction area 333 according to a combination of the address ADD.

The error correction circuit 334 may correct an error of the input datum DIN with the parity PRT and may output the corrected input datum as the output datum DOUT.

If a combination of the address ADD corresponds to the third failure address RT3_ADD and designates a memory cell in the first normal area 331a, the memory control circuit 330 may repair the address ADD so that the repaired address designates a memory cell in the redundancy area 332. In addition, if a combination of the address ADD corresponds to the third failure address RT3_ADD and designates a memory cell in the second normal area 331b, the memory control circuit 330 may correct the input datum DIN through the error correction circuit 333.

As described above, the memory area 300c may change the address ADD to store the input datum DIN into the redundancy area 332 and to output the input datum DIN stored in the redundancy area 332 as the output datum DOUT, if a combination of the address ADD designates the first normal area 331a and corresponds to the first or second failure address RT1_ADD or RT2_ADD after the test mode. In addition, the memory area 300c may store the input datum DIN into the second normal area 331b, may store the parity PRT into the error correction area 333, and may correct an error of the input datum DIN with the parity PRT to output the corrected input datum as the output datum DOUT, if a combination of the address ADD designates the second normal area 331b and corresponds to the first or second failure address RT1_ADD or RT2_ADD after the test mode. Accordingly, since the memory area 300c does not convert the addresses ADD corresponding to the second normal area 331b into addresses of the redundancy area 332, a size of the redundancy area 332 may be reduced to relatively increase a size of the first normal area 331a by the reduced size of the redundancy area 332. Moreover, since the memory area 300c does not store the parity PRT corresponding to the first normal area 331a into the error correction area 333, a size of the error correction area 333 may be reduced to relatively increase a size of the second normal area 331b by the reduced size of the error correction area 333.

Figure 6:
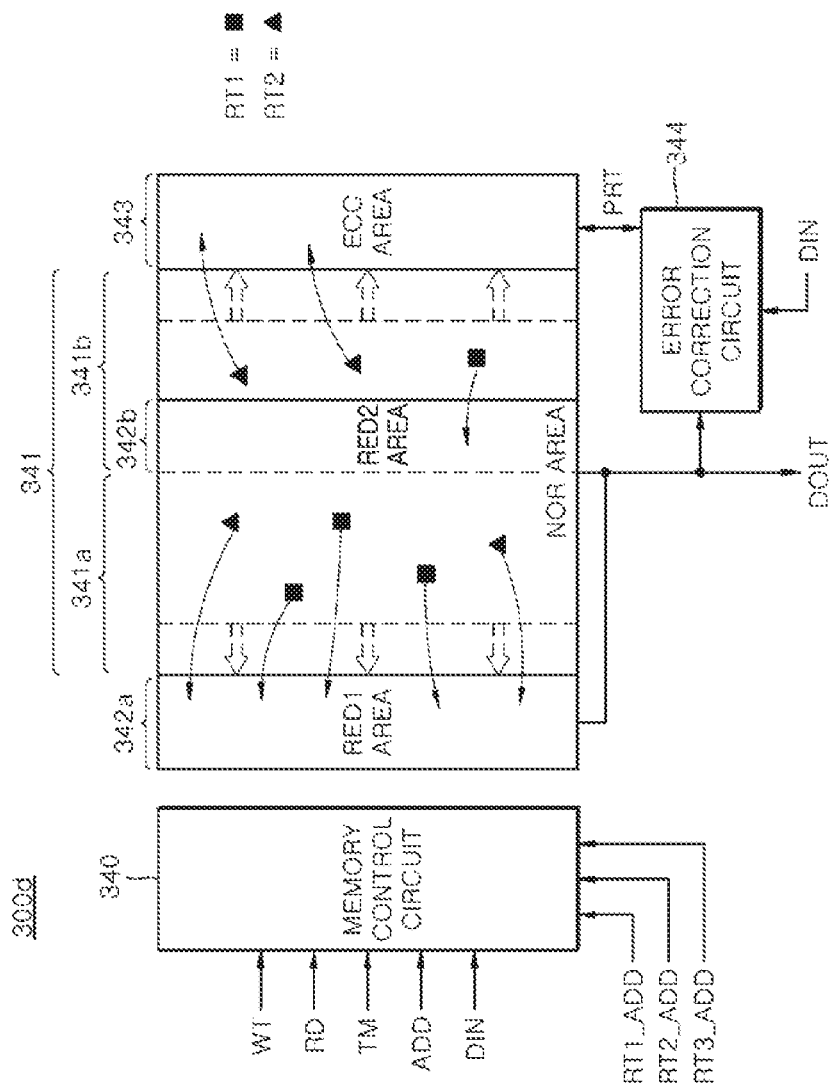

An operation of a memory area 300d corresponding to a fourth example of the memory area 300 illustrated in FIG. 1 will be described hereinafter with reference to FIG. 6 in conjunction with the first and second retention characteristics.

The memory area 300d may include a memory control circuit 340, a normal area 341, a first redundancy area 342a, a second redundancy area 342b, an error correction area 343 and an error correction circuit 344. The normal area 341 may include a first normal area 341a and a second normal area 341b. The second normal area 341b may be set to include the second redundancy area 342b.

The memory control circuit 340 may access the normal area 341 according to the write signal WT, the read signal RD and a combination of the address ADD, if the test mode signal TM is enabled. The normal area 341 may store the input datum DIN having a predetermined level and may output the stored input datum DIN as the output datum DOUT, according to a combination of the address ADD.

The memory control circuit 340 may access the normal area 341 and the error correction area 343 according to a combination of the address ADD in response to the write signal WT or the read signal RD, if the test mode signal TM is disabled.

The memory control circuit 340 may access a memory cell of the first redundancy area 342a to store the input datum DIN into the memory cell of the first redundancy area 342a or to output the input datum DIN stored in the first redundancy area 342a as the output datum DOUT without accessing to memory cells (see the memory cells indicated by a symbol "■" or a symbol "▲") having the first or second retention characteristic in the first normal area 341a, if a combination of the address ADD designates memory cells in the first normal area 341a and corresponds to the first or second failure address RT1_ADD or RT2_ADD. That is, the memory control circuit 340 may change the address ADD to access the first redundancy area 342a if a combination of the address ADD designates memory cells in the first normal area 341a and corresponds to the first or second failure address RT1_ADD or RT2_ADD.

The memory control circuit 340 may access a memory cell of the second redundancy area 342b to store the input datum DIN into the memory cell of the second redundancy area 342b or to output the input datum DIN stored in the second redundancy area 342b as the output datum DOUT without accessing to memory cells (see the memory cells indicated by a symbol "■") having the first retention characteristic in the second normal area 341b, if a combination of the address ADD designates memory cells in the second normal area 341b and corresponds to the first failure address RT1_ADD. That is, the memory control circuit 340 may change the address ADD to access the second redundancy area 342b if a combination of the address ADD designates memory cells in the second normal area 341b and corresponds to the first failure address RT1_ADD.

The memory control circuit 340 may access the second normal area 341b and the error correction area 343 according to a combination of the address ADD in response to the write signal WT, if the test mode signal TM is disabled. The memory control circuit 340 may store the input datum DIN into memory cells (see the memory cells indicated by a symbol "▲") having the second retention characteristic in the second normal area 341b, if a combination of the address ADD designates the second normal area 341b and corresponds to the second failure address RT2_ADD.

The error correction circuit 344 may generate a parity PRT including error information on the input datum DIN and may store the parity PRT into the error correction area 343.

The memory control circuit 340 may access the second normal area 341b and the error correction area 343 according to a combination of the address ADD in response to the read signal RD, if the test mode signal TM is disabled. The memory control circuit 340 may output the input datum DIN stored in memory cells (see the memory cells indicated by the symbol "▲") having the second retention characteristic in the second normal area 341b as the output datum DOUT, according to a combination of the address ADD. The memory control circuit 340 may output the parity PRT from the error correction area 343 according to a combination of the address ADD.

The error correction circuit 344 may correct an error of the input datum DIN with the parity PRT and may output the corrected input datum as the output datum DOUT.

If a combination of the address ADD corresponds to the third failure address RT3_ADD and designates a memory cell in the first normal area 341a, the memory control circuit 340 may repair the address ADD so that the repaired address designates a memory cell in the redundancy area 342. In addition, if a combination of the address ADD corresponds to the third failure address RT3_ADD and designates a memory cell in the second normal area 341b, the memory control circuit 340 may correct the input datum DIN through the error correction circuit 343.

As described above, the memory area 300d may change the address ADD to store the input datum DIN into the first redundancy area 342a and to output the input datum DIN stored in the first redundancy area 342a as the output datum DOUT, if a combination of the address ADD designates the first normal area 341a and corresponds to the first or second failure address RT1_ADD or RT2_ADD after the test mode. In addition, the memory area 300d may change the address ADD to store the input datum DIN into the second redundancy area 342b and to output the input datum DIN stored in the second redundancy area 342b as the output datum DOUT, if a combination of the address ADD designates the second normal area 341b and corresponds to the first failure address RT1_ADD after the test mode. Moreover, the memory area 300d may store the input datum DIN into the second normal area 341b, may store the parity PRT into the error correction area 343, and may correct an error of the input datum DIN with the parity PRT to output the corrected input datum DOUT, if a combination of the address ADD designates the second normal area 341b and corresponds to the second failure address RT2_ADD after the test mode. Accordingly, since the memory area 300d does not convert the addresses ADD corresponding to the second normal area 341b into addresses of the first redundancy area 342a, a size of the first redundancy area 342a may be reduced to relatively increase a size of the first normal area 341a by the reduced size of the first redundancy area 342a. Furthermore, since the memory area 300d does not store the parity PRT corresponding to the first normal area 341a into the error correction area 343, a size of the error correction area 343 may be reduced to relatively increase a size of the second normal area 341b by the reduced size of the error correction area 343.

Figure 7:
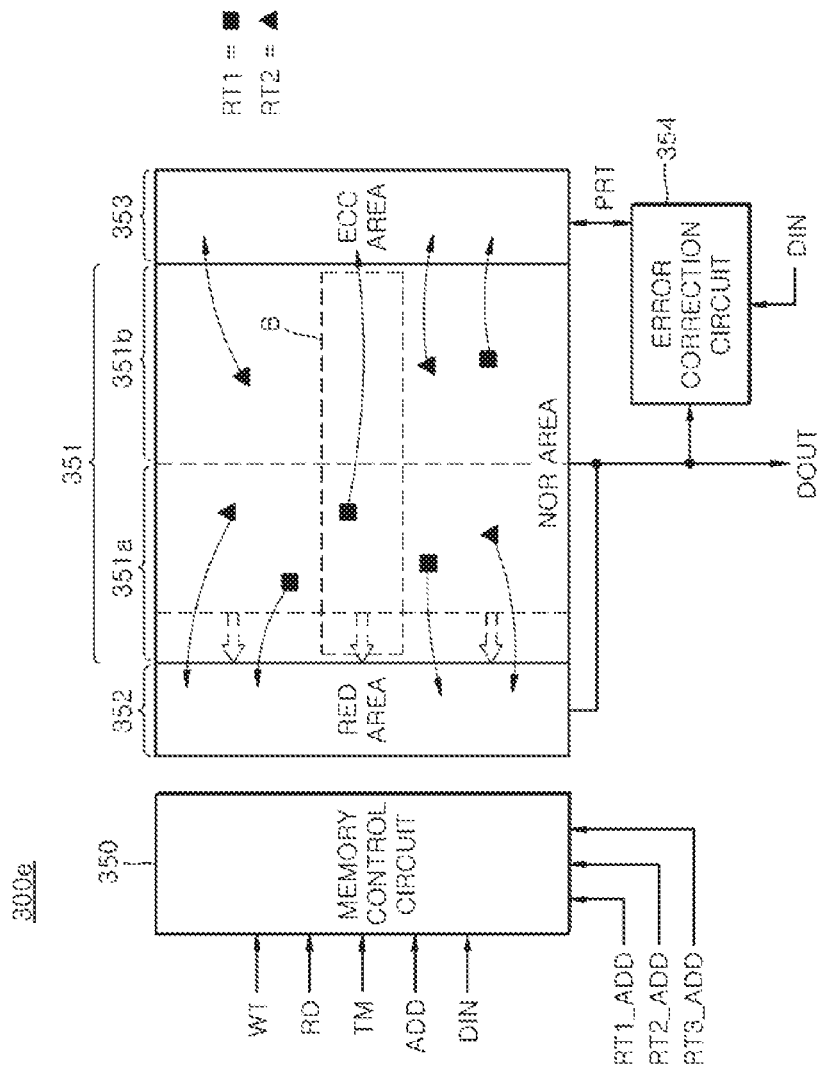

An operation of a memory area 300e corresponding to a fifth example of the memory area 300 illustrated in FIG. 1 will be described hereinafter with reference to FIG. 7 in conjunction with the first and second retention characteristics.

The memory area 300e may include a memory control circuit 350, a normal area 351, a redundancy area 352, an error correction area 353 and an error correction circuit 354. The normal area 351 may include a first normal area 351a and a second normal area 351b.

The memory control circuit 350 may access the normal area 351 according to the write signal WT, the read signal RD and a combination of the address ADD, if the test mode signal TM is enabled. The normal area 351 may store the input datum DIN having a predetermined level and may output the stored input datum DIN as the output datum DOUT, according to a combination of the address ADD.

The memory control circuit 350 may access the normal area 351 and the error correction area 353 according to a combination of the address ADD in response to the write signal WT or the read signal RD, if the test mode signal TM is disabled.

The memory control circuit 350 may access a memory cell of the redundancy area 352 to store the input datum DIN into the memory cell of the redundancy area 352 or to output the stored input datum DIN as the output datum DOUT without accessing to memory cells (see the memory cells indicated by a symbol "■" or a symbol "▲") having the first or second retention characteristic in the first normal area 351a, if a combination of the address ADD designates the first normal area 351a and corresponds to the first or second failure address RT1_ADD or RT2_ADD. That is, the memory control circuit 350 may change the address ADD to access the redundancy area 352 if a combination of the address ADD designates the first normal area 351a and corresponds to the first or second failure address RT1_ADD or RT2_ADD.

The memory control circuit 350 may access the second normal area 351b and the error correction area 353 according to a combination of the address ADD in response to the write signal WT, if the test mode signal TM is disabled. The memory control circuit 350 may store the input datum DIN into memory cells (see the memory cells indicated by a symbol "■" or a symbol "▲") having the first or second retention characteristic in the second normal area 351b, if a combination of the address ADD designates the second normal area 351b and corresponds to the first or second failure address RT1_ADD or RT2_ADD.

The memory control circuit 350 may access the error correction area 353 and memory cells (see the memory cells indicated by a symbol "■") having the first retention characteristic in the first normal area 351a, if a combination of the address ADD designates a region "B" of the first normal area 351a and corresponds to the first failure address RT1_ADD. The region "B" may be set to include a portion of the first normal area 351a and a portion of the second normal area 351b which are located at the same location. The region "B" in the first normal area 351a may include memory cells having the first retention characteristic, and the region "B" in the second normal area 351b may not include any memory cell having the first retention characteristic and any memory cell having the second retention characteristic. A position of the region "B" may be set to be different according to the embodiments.

The error correction circuit 354 may generate a parity PRT including error information on the input datum DIN and may store the parity PRT into the error correction area 353.

The memory control circuit 350 may access the region "B" in the first normal area 351a, the second normal area 351b, or the error correction area 353 according to a combination of the address ADD in response to the read signal RD, if the test mode signal TM is disabled. The memory control circuit 350 may output the input datum DIN stored in memory cells having the first retention characteristic (see the memory cell indicated by a symbol "■") in the region "B" of the first normal area 351a or the input datum DIN stored in memory cells of the second normal area 351b as the output datum DOUT, according to a combination of the address ADD. The memory control circuit 350 may output the parity PRT from the error correction area 353 according to a combination of the address ADD.

The error correction circuit 354 may correct an error of the input datum DIN with the parity PRT and may output the corrected input datum as the output datum DOUT.

If a combination of the address ADD corresponds to the third failure address RT3_ADD and designates a memory cell in the first normal area 351a, the memory control circuit 350 may repair the address ADD so that the repaired address designates a memory cell in the redundancy area 352. In addition, if a combination of the address ADD corresponds to the third failure address RT3_ADD and designates a memory cell in the second normal area 351b, the memory control circuit 350 may correct the input datum DIN through the error correction circuit 353.

As described above, the memory area 300e may change the address ADD to store the input datum DIN into the redundancy area 352 and to output the input datum DIN stored in the redundancy area 352 as the output datum DOUT, if a combination of the address ADD designates the first normal area 351a and corresponds to the first or second failure address RT1_ADD or RT2_ADD after the test mode. In addition, the memory area 300e may store the input datum DIN into the second normal area 351b, may store the parity PRT into the error correction area 353, and may correct an error of the input datum DIN with the parity PRT to output the corrected input datum as the output datum DOUT, if a combination of the address ADD designates the second normal area 351b and corresponds to the first or second failure address RT1_ADD or RT2_ADD after the test mode. Moreover, the memory area 300e may store the input datum DIN into the first normal area 351a, may store the parity PRT into the error correction area 353, and may correct an error of the input datum DIN with the parity PRT to output the corrected input datum as the output datum DOUT, if a combination of the address ADD designates a portion (corresponding to the region "B") of the first normal area 351a and corresponds to the first failure address RT1_ADD after the test mode. Accordingly, since the memory area 300e does not convert the addresses ADD corresponding to the second normal area 351b into addresses of the redundancy area 352, a size of the redundancy area 352 may be reduced to relatively increase a size of the first normal area 351a by the reduced size of the redundancy area 352.

The semiconductor system including any one of the various memory areas described above may sense and detect the retention characteristics of the memory cells in the test mode and may perform a repair operation or an error correction operation of failure addresses according to the retention characteristics to prevent erroneous output data from being outputted after the test mode.

Figure 8:
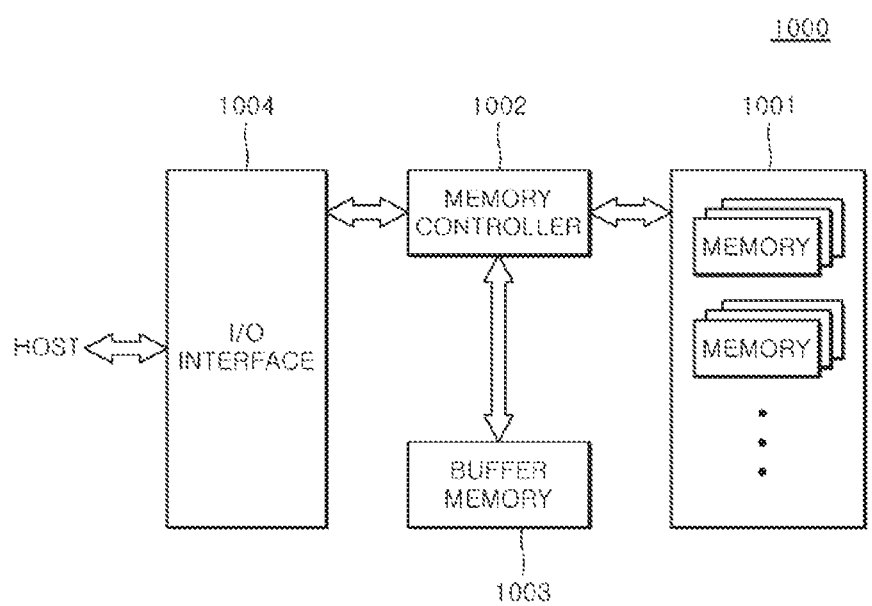
FIG. 8 is a block diagram illustrating a representation of an example of a configuration of an electronic system employing semiconductor devices or the semiconductor system described with reference to FIGS. 1 to 7.

The semiconductor devices or the semiconductor systems described with reference to FIGS. 1 to 7 may be applied to an electronic system that includes a memory system, a graphic system, a computing system, a mobile system, or the like. For example, as illustrated in FIG. 8, an electronic system 1000 according an embodiment may include a data storage circuit 1001, a memory controller 1002, a buffer memory 1003, and an Input and output (input/output) (I/O) interface 1004.

The data storage circuit 1001 may store data which are outputted from the memory controller 1002 or may read and output the stored data to the memory controller 1002, according to a control signal generated from the memory controller 1002. The data storage circuit 1001 may include the second semiconductor devices 20 illustrated in FIG. 1. Meanwhile, the data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. The memory controller 1002 may include the first semiconductor devices 10 illustrated in FIG. 1. Although FIG. 8 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB) drive, a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB drive, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

Figure 9:
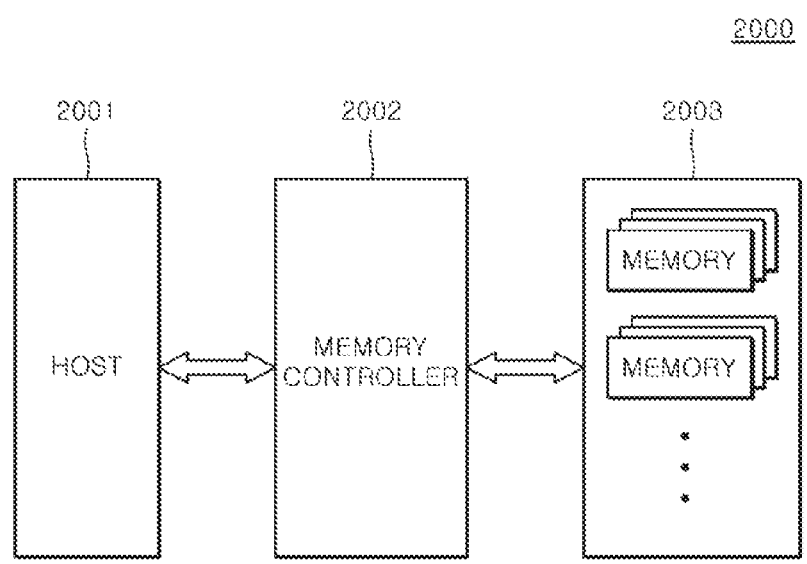
FIG. 9 is a block diagram illustrating a representation of an example of a configuration of an electronic system employing semiconductor devices or the semiconductor system described with reference to FIGS. 1 to 7.

Referring to FIG. 9, an electronic system 2000 according an embodiment may include a host 2001, a memory controller 2002 and a data storage circuit 2003.

The host 2001 may output a request signal and data to the memory controller 2002 to access the data storage circuit 2003. The memory controller 2002 may supply the data, a data strobe signal, a command, addresses and a clock signal to the data storage circuit 2003 in response to the request signal, and the data storage circuit 2003 may execute a write operation or a read operation in response to the command. The host 2001 may transmit the data to the memory controller 2002 to store the data into the data storage circuit 2003. In addition, the host 2001 may receive the data outputted from the data storage circuit 2003 through the memory controller 2002. The host 2001 may include a circuit that corrects errors of the data using an error correction code (ECC) scheme.

The memory controller 2002 may act as an interface that connects the host 2001 to the data storage circuit 2003 for communication between the host 2001 and the data storage circuit 2003. The memory controller 2002 may receive the request signal and the data outputted from the host 2001 and may generate and supply the data, the data strobe signal, the command, the addresses and the clock signal to the data storage circuit 2003 in order to control operations of the data storage circuit 2003. In addition, the memory controller 2002 may supply the data outputted from the data storage circuit 2003 to the host 2001. The memory controller 2002 may include the first semiconductor devices 10 of FIG. 1.

The data storage circuit 2003 may include a plurality of memories. The data storage circuit 2003 may receive the data, the data strobe signal, the command, the addresses and the clock signal from the memory controller 2002 to execute the write operation or the read operation. Each of the memories included in the data storage circuit 2003 may include a circuit that corrects the errors of the data using an error correction code (ECC) scheme. The data storage circuit 2003 may include the second semiconductor devices 20 of FIG. 1.

In some embodiments, the electronic system 2000 may be realized to selectively operate any one of the ECC circuits included in the host 2001 and the data storage circuit 2003. Alternatively, the electronic system 2000 may be realized to simultaneously operate all of the ECC circuits included in the host 2001 and the data storage circuit 2003. The host 2001 and the memory controller 2002 may be realized in a single chip according to the embodiments. The memory controller 2002 and the data storage circuit 2003 may be realized in a single chip according to the embodiments.

What is claimed is:

1. A semiconductor system comprising:
    a first semiconductor device configured to output a command, an address and an input datum; and
    a second semiconductor device comprising a normal area and a redundancy area, wherein the second semiconductor device is configured to repair the address to store the input datum into the redundancy area and to output the input datum stored in the redundancy area as an output datum or configured to correct an error of the input datum stored in the normal area to output the corrected input datum as the output datum, based on the command and the address according to a retention characteristic of a memory cell, included in the normal area, corresponding to the address,
    wherein the retention characteristic is a first retention characteristic or a second retention characteristic, and
    wherein when the retention characteristic of the memory cell is the first retention characteristic less numbers of failed bits occur from the memory cell than when the retention characteristic of the memory cell is the second retention characteristic.

2. The semiconductor system of claim 1, wherein a period for which a logic level of the input datum stored in a memory cell having the second retention characteristic in the normal area is retained is longer than a period for which a logic level of the input datum stored in a memory cell having the first retention characteristic in the normal area is retained.

3. The semiconductor system of claim 1, wherein the second semiconductor device includes:
    a memory area configured to store the input datum according to a combination of the address based on a write signal in a test mode, configured to output the input datum stored therein as the output datum based on a read signal after a first predetermined period in the test mode, and configured to output the input datum stored therein as the output datum based on the read signal after a second predetermined period in the test mode;
    a test circuit configured to sense a logic level of the output datum after the first predetermined period to generate a first retention information signal which is enabled if the sensed logic level of the output datum corresponds to the first retention characteristic and configured to sense a logic level of the output datum after the second predetermined period to generate a second retention information signal which is enabled if the sensed logic level of the output datum corresponds to the second retention characteristic; and
    a failure address storage circuit configured to store the address as a first failure address based on the first retention information signal and configured to store the address as a second failure address based on the second retention information signal.

4. The semiconductor system of claim 3, wherein the first failure address includes position information on memory cells having the first retention characteristic in the normal area and the second failure address includes position information on memory cells having the second retention characteristic in the normal area.

5. The semiconductor system of claim 3, wherein the memory area changes the address to store the input datum into the redundancy area and to output the input data stored in the redundancy area as the output datum, if a combination of the address corresponds to the first failure address after the test mode.

6. The semiconductor system of claim 3, wherein the memory area stores the input datum into the normal area, stores a parity into an error correction area, and corrects an error of the input datum with the parity to output the corrected input datum as the output datum, if a combination of the address corresponds to the second failure address after the test mode.

7. The semiconductor system of claim 3, wherein the memory area includes:
   a memory control circuit configured to access the redundancy area based on a test mode signal, the write signal and the read signal if the address corresponds to the first failure address and configured to access the normal area and an error correction area based on the test mode signal, the write signal and the read signal if the address corresponds to the second failure address; and
   an error correction circuit configured to generate a parity including error information on the input datum and configured to correct an error of the input datum with the parity.

8. The semiconductor system of claim 3,
   wherein if a first combination of the address corresponds to the first failure address after the test mode, the memory area changes the first combination of the address to store the input datum into the redundancy area and to output the input datum stored in the redundancy area as the output datum; and
   wherein if a second combination of the address corresponds to the first failure address after the test mode, the memory area stores the input datum into the normal area based on the address having the second combination, stores a parity into an error correction area, and corrects an error of the input datum with the parity to output the corrected input datum as the output datum.

9. The semiconductor system of claim 3,
   wherein the normal area includes a first normal area and a second normal area;
   wherein if a combination of the address designates the first normal area and corresponds to the first or second failure address after the test mode, the memory area changes the address to store the input datum into the redundancy area and to output the input datum stored in the redundancy area as the output datum; and
   wherein if a combination of the address designates the second normal area and corresponds to the first or second failure address after the test mode, the memory area stores the input datum into the second normal area, stores a parity into an error correction area, and corrects an error of the input datum with the parity to output the corrected input datum as the output datum.

10. The semiconductor system of claim 3,
    wherein the normal area includes a first normal area and a second normal area;
    wherein the redundancy area includes a first redundancy area and a second redundancy area;
    wherein if a combination of the address designates the first normal area and corresponds to the first or second failure address after the test mode, the memory area changes the address to store the input datum into the first redundancy area and to output the input datum stored in the first redundancy area as the output datum;
    wherein if a combination of the address designates the second normal area and corresponds to the first failure address after the test mode, the memory area changes the address to store the input datum into the second redundancy area and to output the input datum stored in the second redundancy area as the output datum; and
    wherein if a combination of the address designates the second normal area and corresponds to the second failure address after the test mode, the memory area stores the input datum into the second normal area, stores a parity into an error correction area, and corrects an error of the input datum with the parity to output the corrected input datum as the output datum.

11. The semiconductor system of claim 3,
    wherein the normal area includes a first normal area and a second normal area;
    wherein if a combination of the address designates the first normal area and corresponds to the first or second failure address after the test mode, the memory area changes the address to store the input datum into the redundancy area and to output the input datum stored in the redundancy area as the output datum;
    wherein if a combination of the address designates the second normal area and corresponds to the first or second failure address after the test mode, the memory area stores the input datum into the second normal area, stores a parity into an error correction area, and corrects an error of the input datum with the parity to output the corrected input datum as the output datum; and
    wherein if a combination of the address designates a portion of the first normal area and corresponds to the first failure address after the test mode, the memory area stores the input datum into the first normal area, stores a parity into the error correction area, and corrects an error of the input datum with the parity to output the corrected input datum as the output datum.

12. The semiconductor system of claim 3, wherein the second semiconductor device includes:
    a command decoder configured to generate the write signal, the read signal and a test mode signal,
    wherein the command decoder generates the test mode signal which is enabled if the command has a combination for entering the test mode,
    wherein the command decoder generates the write signal which is enabled if the command has a combination for entering the test mode, and
    wherein the command decoder generates the read signal which is enabled after the first predetermined period from a point of time that the write signal is enabled, if the command has a combination for entering the test mode.

13. The semiconductor system of claim 12, wherein the command decoder generates the read signal which is enabled after a second predetermined period from a point of time that the write signal is enabled, if the command has a combination for entering the test mode.

14. The semiconductor system of claim 3, wherein the second semiconductor device includes:
    a buffer circuit configured to receive the address and the input datum and buffer the address and the input datum to output the buffered address to the memory area and the failure address storage circuit and output the buffered input datum to the memory area.

15. A semiconductor device comprising:
    a memory area comprising a redundancy area and a normal area, wherein the memory area is configured to compare an address with a first failure address and a second failure address to store an input datum into the redundancy area and to output the stored input datum as an output datum or configured to compare the address with the first and failure addresses to correct an error of an input datum stored in the normal area to output the corrected input datum as the output datum; and
    a failure address storage circuit configured to store the address as a first failure address based on a first retention information signal and configured to store the address as a second failure address based on a second retention information signal,
    wherein the first retention information signal indicates less numbers of failed bits occurring in an output datum for the address than the second retention information signal indicates occurring for a number of failed bits included in an output datum for the address.

16. The semiconductor device of claim 15,
wherein the failure address storage circuit is configured to store the address as the first failure address based on the first retention information signal while in a test mode, and
wherein the failure address storage circuit is configured to store the address as the second failure address based on the second retention information signal while in the test mode.

17. The semiconductor device of claim 15, wherein the first failure address includes position information on memory cells having a first retention characteristic and the second failure address includes position information on memory cells having a second retention characteristic.

18. The semiconductor device of claim 17, wherein a period for which a logic level of the input datum stored in a memory cell having the second retention characteristic in the normal area is retained is longer than a period for which a logic level of the input datum stored in a memory cell having the first retention characteristic in the normal area is retained.

19. The semiconductor device of claim 15, wherein the memory area changes the address to store the input datum into the redundancy area and to output the input data stored in the redundancy area as the output datum, if a combination of the address corresponds to the first failure address.

20. The semiconductor device of claim 15, wherein the memory area stores the input datum into the normal area, stores a parity into an error correction area, and corrects an error of the input datum with the parity to output the corrected input datum as the output datum, if a combination of the address corresponds to the second failure address.

21. The semiconductor device of claim 15, wherein the memory area includes:
a memory control circuit configured to access the redundancy area based on a test mode signal, a write signal and a read signal if the address corresponds to the first failure address and configured to access the normal area and an error correction area based on the test mode signal, the write signal and the read signal if the address corresponds to the second failure address; and
an error correction circuit configured to generate a parity including error information on the input datum and configured to correct an error of the input datum with the parity.

22. The semiconductor device of claim 15,
wherein the normal area includes a first normal area and a second normal area;
wherein if a combination of the address designates the first normal area and corresponds to the first or second failure address, the memory area changes the address to store the input datum into the redundancy area and to output the input datum stored in the redundancy area as the output datum; and
wherein if a combination of the address designates the second normal area and corresponds to the first or second failure address, the memory area stores the input datum into the second normal area, stores a parity into an error correction area, and corrects an error of the input datum with the parity to output the corrected input datum as the output datum.

23. The semiconductor device of claim 15,
wherein the normal area includes a first normal area and a second normal area;
wherein the redundancy area includes a first redundancy area and a second redundancy area;
wherein if a combination of the address designates the first normal area and corresponds to the first or second failure address, the memory area changes the address to store the input datum into the first redundancy area and to output the input datum stored in the first redundancy area as the output datum;
wherein if a combination of the address designates the second normal area and corresponds to the first failure address, the memory area changes the address to store the input datum into the second redundancy area and to output the input datum stored in the second redundancy area as the output datum; and
wherein if a combination of the address designates the second normal area and corresponds to the second failure address, the memory area stores the input datum into the second normal area, stores a parity into an error correction area, and corrects an error of the input datum with the parity to output the corrected input datum as the output datum.

24. The semiconductor device of claim 15,
wherein the normal area includes a first normal area and a second normal area;
wherein if a combination of the address designates the first normal area and corresponds to the first or second failure address, the memory area changes the address to store the input datum into the redundancy area and to output the input datum stored in the redundancy area as the output datum;
wherein if a combination of the address designates the second normal area and corresponds to the first or second failure address, the memory area stores the input datum into the second normal area, stores a parity into an error correction area, and corrects an error of the input datum with the parity to output the corrected input datum as the output datum; and
wherein if a combination of the address designates a portion of the first normal area and corresponds to the first failure address, the memory area stores the input datum into the first normal area, stores a parity into the error correction area, and corrects an error of the input datum with the parity to output the corrected input datum as the output datum.

25. A semiconductor system comprising:
a semiconductor device comprising a normal area and a redundancy area, wherein the semiconductor device is configured to, receive a command, an address, and an input datum, repair the address so that the repaired address designates a memory cell in the redundancy area and configured to use the input datum designated in the memory cell in the redundancy area as an output datum or configured to correct an error of the input datum stored in the normal area to use the corrected input datum as the output datum, based on the command and the address according to a retention characteristic of a memory cell, included in the normal area, corresponding to the address,
wherein the retention characteristic is a first retention characteristic or a second retention characteristic, and
wherein when the retention characteristic of the memory cell is the first retention characteristic less numbers of failed bits occur from the memory cell than when the retention characteristic of the memory cell is the second retention characteristic.

* * * * *